US010824287B2

(12) United States Patent
Hwang et al.

(10) Patent No.: US 10,824,287 B2
(45) Date of Patent: Nov. 3, 2020

(54) DISPLAY DEVICE WITH TOUCH SENSOR AND METHOD OF MANUFACTURING SAME

(71) Applicant: LG DISPLAY CO., LTD., Seoul (KR)

(72) Inventors: KwangJo Hwang, Gyeonggi-do (KR); Sangkyu Kim, Gyeonggi-do (KR); JiHyun Jung, Gyeonggi-do (KR); DeukSu Lee, Gyeonggi-do (KR); Jaeseung Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 27 days.

(21) Appl. No.: 16/176,478

(22) Filed: Oct. 31, 2018

(65) Prior Publication Data

US 2019/0138128 A1 May 9, 2019

(30) Foreign Application Priority Data

Oct. 31, 2017 (KR) .................. 10-2017-0144328

(51) Int. Cl.
  *G06F 3/045* (2006.01)
  *G06F 3/044* (2006.01)
  *H01L 27/32* (2006.01)
  *G06F 3/041* (2006.01)

(52) U.S. Cl.
  CPC ............ *G06F 3/044* (2013.01); *G06F 3/0443* (2019.05); *G06F 3/0448* (2019.05); *G06F 3/04164* (2019.05); *H01L 27/323* (2013.01); *G06F 2203/04103* (2013.01); *G06F 2203/04112* (2013.01); *H01L 27/3276* (2013.01); *H01L 2227/323* (2013.01)

(58) Field of Classification Search
  USPC ........... 345/173, 174, 206, 205, 207; 349/12
  See application file for complete search history.

(56) References Cited

U.S. PATENT DOCUMENTS

| | | | | |
|---|---|---|---|---|
| 2013/0335365 A1* | 12/2013 | Kim | .................. | G06F 3/044 345/174 |
| 2014/0139761 A1* | 5/2014 | Yanagawa | ............. | H01L 27/323 349/12 |
| 2014/0168109 A1* | 6/2014 | Kang | .................... | G06F 3/044 345/173 |
| 2015/0022501 A1* | 1/2015 | Kita | .................... | G02F 1/13338 345/174 |
| 2015/0145818 A1* | 5/2015 | Jeon | .................. | G06F 3/044 345/174 |
| 2015/0145821 A1* | 5/2015 | Kim | .................... | G06F 3/0412 345/174 |
| 2015/0185938 A1* | 7/2015 | Han | ...................... | G06F 3/0412 345/173 |
| 2015/0206501 A1* | 7/2015 | Kurasawa | ............. | G09G 3/2092 345/206 |
| 2016/0085339 A1* | 3/2016 | Yashiro | .................. | G06F 3/044 345/174 |

(Continued)

*Primary Examiner* — Thuy N Pardo
(74) *Attorney, Agent, or Firm* — Polsinelli PC

(57) ABSTRACT

An aspect of the present disclosure may provide a display device including: a light-emitting layer including a plurality of light-emitting areas; a plurality of touch wiring lines arranged in a first direction so as to overlap the light-emitting area; and a touch electrode formed on the plurality of touch wiring lines. Further, a method of manufacturing the display device may be provided.

18 Claims, 20 Drawing Sheets

(56) References Cited

U.S. PATENT DOCUMENTS

| | | | | |
|---|---|---|---|---|
| 2016/0253001 A1* | 9/2016 | Sugita | ............... | G06F 3/044 |
| | | | | 345/174 |
| 2017/0160845 A1* | 6/2017 | Lee | ............... | G06F 3/0412 |
| | | | | 345/174 |
| 2017/0213873 A1* | 7/2017 | Bok | ............... | H01L 51/5206 |
| | | | | 345/204 |
| 2020/0020747 A1* | 1/2020 | Bok | ............... | H01L 27/3276 |
| | | | | 345/205 |

* cited by examiner

DISPLAY DEVICE WITH TOUCH SENSOR AND METHOD OF MANUFACTURING SAME

CROSS REFERENCE TO RELATED APPLICATION

This application claims priority from Korean Patent Application No. 10-2017-0144328, filed on Oct. 31, 2017, which is hereby incorporated by reference in its entirety for all purposes as if fully set forth herein.

BACKGROUND

Field of the Disclosure

The present disclosure relates to a display device including a touch sensor and a method for manufacturing the display device.

Description of the Background

Demand for display devices for displaying an image has been increasing in various forms, and various types of display devices, such as a Liquid Crystal Display (LCD) device, a plasma display device, and an Organic Light Emitting Diode (OLED) display device, have been utilized.

Among the above display devices, the OLED display device, which is a self-luminous device, has been recently spotlighted because it is excellent in viewing angle, response speed, and color reproducibility, and can be implemented to have a thin profile.

In addition, a display device may operate by receiving a user's command input through various input devices such as a key board or a mouse, and is being developed as an input device of a touch panel display device, which enables a user's command to be intuitively and conveniently input by touching a screen of a display device. The touch panel may be disposed on the screen of the display device, and the display device may receive the input of a user's command when the user touches a specific point on the screen of the display device. Since the touch panel senses touch coordinates, it may be called a touch sensor unit.

The above-described display device may be configured such that the touch panel is mounted thereon. When the touch panel is mounted on the display device, the distance between the wiring of the touch panel and the wiring in the display device is reduced, which increases the magnitude of a parasitic capacitance between the touch panel and the display device becomes large, thereby increasing power consumption.

In addition, the display device includes a display area in which an image is displayed and a bezel area, which is located outside the display area. Recently, attempts are being taken to reduce the width of the bezel area in consideration of design or the like. However, when the touch panel is mounted on the display device, it is necessary to transmit touch signals, which may cause the number of signals transmitted to the display device to further increase. In addition, there is a limit in reducing the width of the bezel region by wiring for outputting a large number of signals to the outside.

SUMMARY

Accordingly, the present disclosure is to provide a display device including a touch sensor that may enable implementation of a thin bezel, and a method of manufacturing the display device.

Another aspect of the present disclosure is to provide a display device including a touch sensor which may enable reduction of power consumption, and a method of manufacturing the display device.

In one aspect, the present disclosure may provide a display device including: a light-emitting layer including a plurality of light-emitting areas; a plurality of touch wiring lines arranged in a first direction so as to overlap the light-emitting area; and a touch electrode formed on the plurality of touch wiring lines.

In another aspect, the present disclosure may provide a display device including: a light-emitting layer including a plurality of light-emitting areas and a non-light-emitting area disposed between the light-emitting areas; a plurality of touch wiring lines arranged on the light emitting layer to be connected to the non-light-emitting area; and a touch electrode disposed on at least one of the plurality of touch wiring lines.

In yet another aspect, the present disclosure may provide a method of manufacturing a display device. The method includes: forming a plurality of data lines and a plurality of gate lines intersecting each other such that the plurality of data lines or the plurality of gate lines are arranged in a first direction; disposing a plurality of touch wiring lines on the data lines and the gate lines in such a manner that, among the plurality of touch wiring lines, at least one touch wiring line is disposed in the first direction between two adjacent data lines or between two adjacent gate lines; and disposing a touch electrode formed on at least one touch wiring line among the plurality of touch wiring lines.

According to the present disclosure, it is possible to provide a display device in which a thin bezel is capable of being implemented, and a method of manufacturing the display device.

Further, according to the present disclosure, it is possible to provide a display device, which is capable of being mounted with a touch sensor unit and capable of reducing power consumption, and a method of manufacturing the display device.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
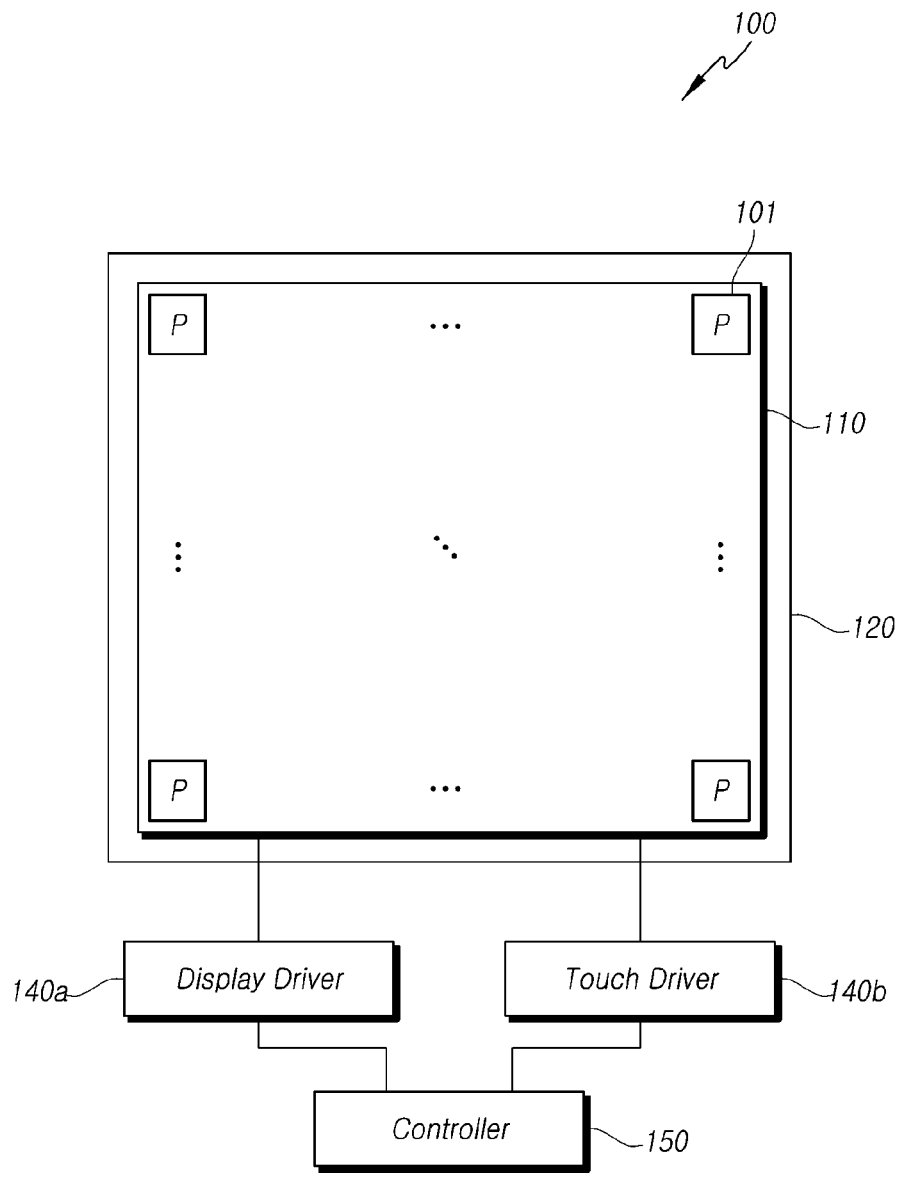
FIG. 1 is a structural view illustrating a display device according to aspects of the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a structural view illustrating a display device according to aspects of the present disclosure.

Referring to FIG. 1, a display device 100 may include a display panel 110, a touch sensor unit 120, a display driver 140a, a touch driver 140b, and a controller 150.

The display panel 110 may include a plurality of pixels 101 arranged in a matrix form. Each pixel 101 may include an OLED and a pixel circuit (not illustrated) for supplying a driving current to the organic light emitting diode OLED. The pixel circuit may receive a data signal in response to a gate signal so as to generate a driving current, and may supply the driving current to the organic light emitting diode OLED. In addition, the display panel 110 may be driven by receiving a plurality of voltages. The plurality of voltages transmitted to the display panel 110 may include a first voltage EVDD and a second voltage EVSS having a voltage level lower than that of the first voltage EVDD. The display panel 110 may be configured such that a driving current flows therein by the first voltage EVDD and the second voltage EVSS. The first voltage EVDD may be supplied for each pixel column and the second voltage EVSS may be a common voltage supplied to the plurality of pixels 101 in common.

The touch sensor unit 120 may be disposed on the display panel 110 and may sense a touch of a user's stylus pen. Here, the touch does not only mean a direct touch, but may include approaching at a predetermined interval.

The display driver 140a may transmit a gate signal and a data signal to the display panel 110. The display driver 140a may receive an image signal so as to generate a data signal. Here, it is illustrated that the number of display drivers 140a is one, but the present disclosure is not limited thereto. The number of display drivers 140a may be determined depending on the size or resolution of the display panel 110. The display driver 140a may be implemented as an integrated circuit.

The touch driver 140b may transmit a touch driving signal to the touch sensor unit 120 and may receive a touch sensing signal in response to the touch driving signal. The touch driver 140b may be implemented as an integrated circuit.

The controller 150 may control each of the display driver 140a and the touch driver 140b. In addition, the controller 150 may supply an image signal to the display driver 140a.

Figure 2:
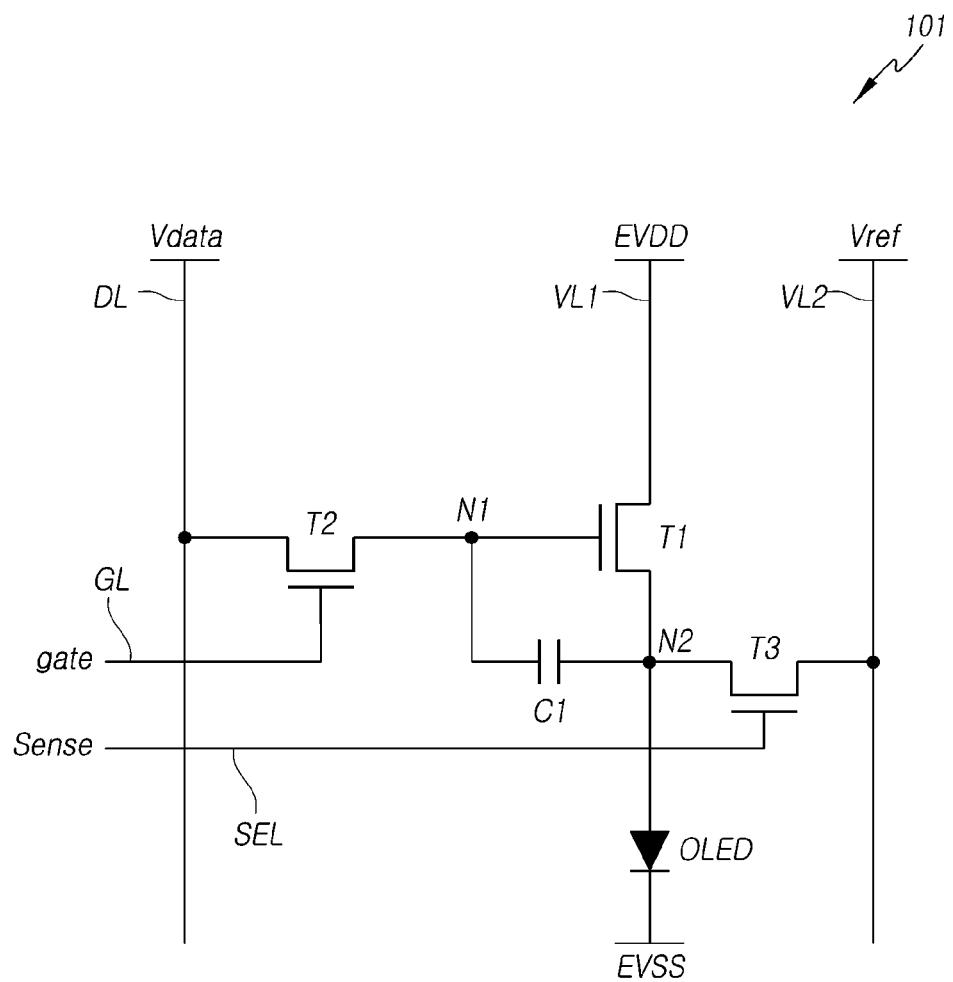
FIG. 2 is a circuit diagram illustrating a pixel according to aspects of the present disclosure.

FIG. 2 is a circuit diagram illustrating a pixel according to aspects of the present disclosure.

Referring to FIG. 2, the pixel 101 may include a pixel circuit including an OLED, first to third transistors T1 to T3, and a capacitor C1. Here, the first transistor T1 may be a driving transistor that drives a driving current flowing in the OLED.

The first transistor T1 may have a first electrode connected to a first voltage line VL1 to receive the first voltage EVDD, a second electrode connected to a second node N2, and a gate electrode connected to a first node N1. In addition, the second transistor T2 may have a first electrode connected to a data line DL, a second electrode connected to the first node N1, and a gate electrode connected to a gate line GL. The third transistor T3 may have a first electrode connected to the second node N2, a second electrode connected to a second voltage line VL2, and a third electrode connected to a sensing control signal line SEL. Here, the sensing control signal line SEL may be a gate line GL. The gate line GL and the data line DL may intersect each other.

The OLED may have an anode electrode connected to the second node N2 and a cathode electrode, to which a second voltage EVSS may be transmitted. The cathode electrode may be connected to the second voltage line. Therefore, the driving current supplied through the first transistor T1 may flow in the OLED. In addition, a capacitor C1 may be connected between the first node N1 and the second node N2 and may maintain a voltage applied to the first node N1. The first voltage line VL1 may receive the first voltage EVDD and the second voltage line VL2 may receive a reference voltage Vref.

Figure 3:
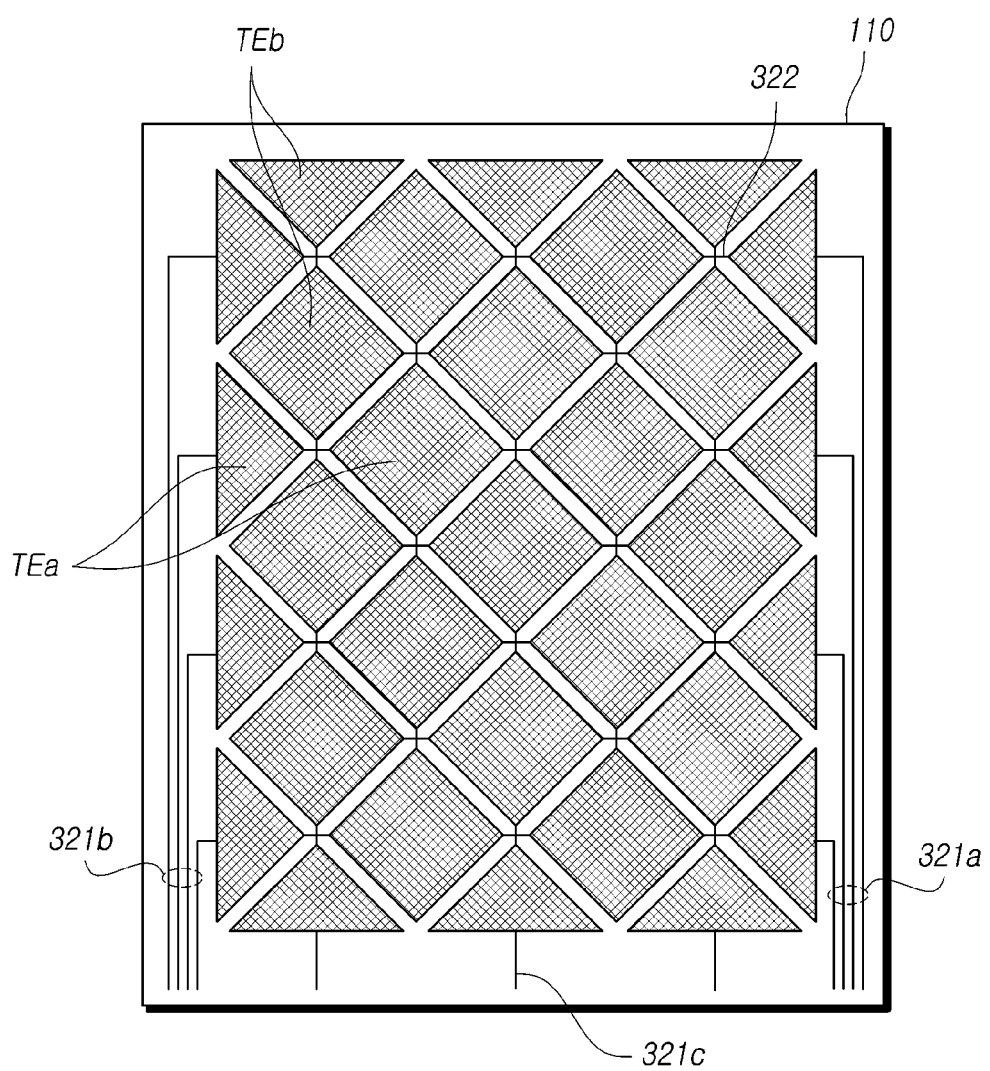
FIG. 3 is a plan view illustrating a touch sensor unit according to aspects of the present disclosure.

FIG. 3 is a plan view illustrating a touch sensor unit according to aspects of the present disclosure.

Referring to FIG. 3, the touch sensor unit may be disposed on the display panel 110, and may include a plurality of first electrodes TEa and a plurality of second electrodes TEb. The plurality of first electrodes TEa may correspond to touch driving electrodes TE1a and the plurality of second electrodes TEb may correspond to touch sensing electrodes TEb. The plurality of first electrodes TEa may be connected in the horizontal direction by connection portions 322 so as to form a plurality of electrode rows, and the plurality of second electrodes TEb may be connected in the vertical direction by the connection portions 322 so as to form a plurality of electrode columns. Here, the plurality of first electrodes TEa and the plurality of second electrodes TEb are illustrated as being arranged in a 4×3 form, but the present disclosure is not limited thereto.

The first electrodes TEa may receive a touch driving signal, and the second electrodes TEb may transmit a touch sensing signal that corresponds to the touch driving signal. The first electrodes TEa and the second electrodes TEb may be formed on the same layer on the display panel 110. However, the present disclosure is not limited thereto.

Each connection portion 322 may be configured to connect one first electrode TEa to other first electrodes. In addition, the connection portion 322 may be configured to connect one second electrode TEb to other second electrodes. The connection portions 322 intersect each other. In order to ensure that the first electrodes TEa and the second electrodes TEb are not directly connected to each other, the connection portions 322 that connect the first electrodes TEa to each other, may be formed in a layer that is different from a layer where the first electrodes TEa and the second electrodes TEb are formed, and the first electrodes TEa and the connection portions 322 may be connected to each other through vias. The connection portions 322 that connect the second electrodes TEb to each other may be formed in a layer that is the same as the layer where the first electrodes TEa and the second electrodes TEb are formed, so that the second electrodes TEb can be connected in the same layer. Accordingly, an insulating film (not illustrated) may be disposed between the connection portions 322 that connect the first electrodes TEa and the connection portions 322 that connect the second electrodes TEb.

In addition, the first electrodes TEa and the second electrodes TEb may be formed by patterning a conductive metallic layer. In addition, the first electrodes TEa and the second electrodes TEb may be formed of a transparent material, such as Indium Tin Oxide (ITO). In addition, the patterned first electrodes TEa and second electrodes TEb may include an electrode pattern formed in the form of a mesh, and the first electrodes TEa and the second electrodes TEb may include a plurality of openings. Light, which is emitted from the display device through the first electrodes TEa and the second electrodes TEb made of the ITO electrodes or the plurality of openings included in the first electrodes TEa and the second electrodes TEb, may be transmitted through the first electrodes TEa and the second electrodes TEb, or may be emitted to the outside through the plurality of openings. The patterns of the first electrodes TEa and the second electrodes TEb formed in the form of a mesh may be referred to as touch electrode lines. In addition, the first electrodes TEa and the second electrodes TEb may be connected to driving lines 321a and 321b that cause a driving signal, which drives the first electrodes TEa and the second electrodes TEb, to be applied to a touch electrode, and sensing lines 321c that cause a sensing signal, which is generated in response to a touch sensed by the touch electrode, to be transmitted.

In the touch sensor unit described above, the driving lines 321a and 321b that apply a signal to the first touch electrodes TEa may be disposed on the left and right sides of the display panel 110, and the sensing lines 321c may be disposed on the lower side of the display panel 110. As a result, there is a problem in that the width of the bezel area, which may be formed on the left and right sides of the display panel 110, is increased.

Figure 4:
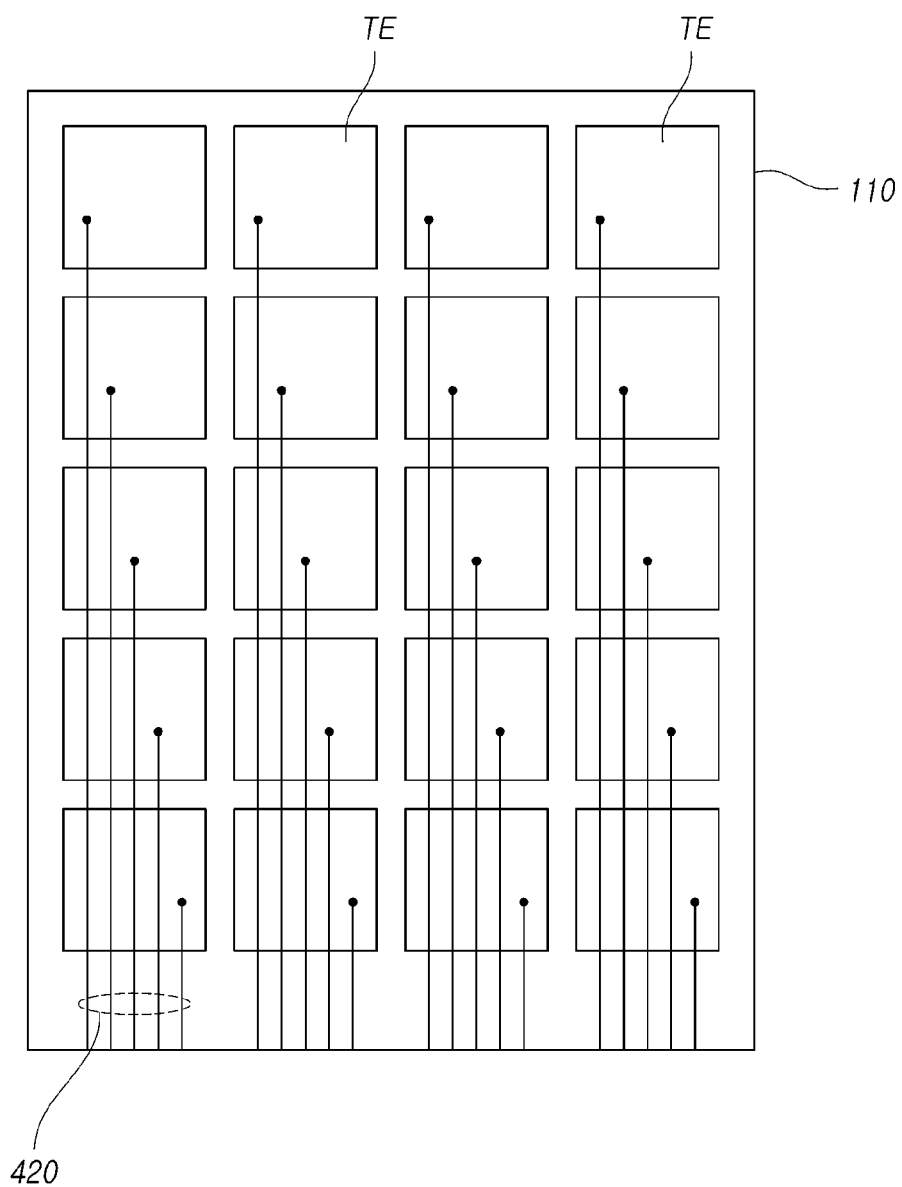
FIG. 4 is a plan view illustrating a touch sensor unit according to aspects of the present disclosure.

FIG. 4 is a plan view illustrating a touch sensor unit according to aspects of the present disclosure.

Referring to FIG. 4, the touch sensor unit may be disposed on the display panel 110, and a plurality of touch electrodes TE, each having a predetermined area, may be arranged in a matrix form on the display panel 110. In addition, a plurality of touch wiring lines 420 may be connected to the touch electrodes TE so as to receive a touch sensing signal from the touch electrodes TE, respectively. The touch wirings 520 are disposed under the touch electrodes and may be in contact with a region of the touch electrodes TE. The touch electrodes TE and the touch wirings 420 may be mounted in the display panel 110, and as a result, when the display device 110 is made not to include a separate touch panel on the display panel 110, the display panel 110 may be implemented to be thinner.

Unlike the touch sensor unit illustrated in FIG. 4, the touch sensor unit may have touch wiring lines, to which a touch signal is transmitted, on the lower side of the display panel 110, without having driving lines formed on the left and right sides of the display panel 110. Therefore, since no signal wiring is formed on the left and right sides of the display panel 110, there is no problem that the bezel areas on the right and left sides of the display panel 110 are increased.

Figure 5:
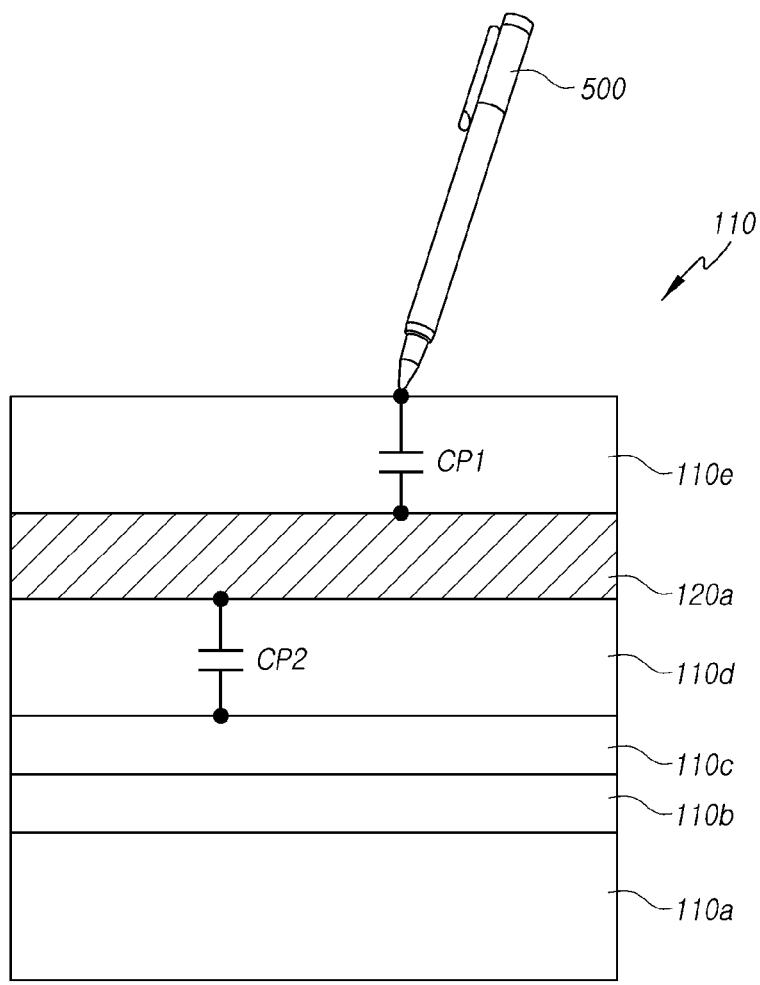
FIG. 5 is a cross-sectional view illustrating a cross-section of a display device according to aspects of the present disclosure.

FIG. 5 is a cross-sectional view illustrating a cross-section of a display device according to aspects of the present disclosure.

Referring to FIG. 5, the display device 100 may include a display panel 110 that includes a substrate 110b on which a back plate 110a, a gate line, a data line, and a transistor are disposed, and a light-emitting layer 110c including an OLED and disposed on the substrate 110b, and a sealing substrate 110d sealing the light emitting layer 110c and a sealing substrate 110d sealing the light-emitting layer 110c, and a touch sensor unit 120a disposed on the sealing substrate 110d. A cover glass 110e may be disposed on the touch sensor unit 120a on the display panel 110. The light-emitting layer 110c may include a node electrode, a cathode electrode, and an organic light-emitting film disposed between the anode electrode and the cathode electrode. The structure of the display device 100 is not limited thereto.

The display panel 110 operates in such a manner that an operation period thereof is divided into a display period and a touch sensing period. In the display period, the display panel 110 is driven to display an image, and in the touch sensing period, the touch sensor unit 120 is operated such that a touch position can be detected. The touch sensor unit 120 may be driven in a self-capping manner during the touch sensing period. The self-capping method may be a method of sensing a touch using a parasitic capacitance CP1, which is formed between a stylus pen and the touch sensor unit 120 and is generated when a user touches the cover glass 110e using the stylus pen.

In addition, in the touch sensing period, the light-emitting layer 110d disposed under the touch sensor unit 120a may include a conductor and may maintain a constant voltage. Accordingly, a parasitic capacitance CP2 may be formed between the touch sensor unit 120a and the light emitting layer 110d in the self-capping method.

The power consumption may be increased by the parasitic capacitance CP2 formed between the touch sensor unit 120 and the light emitting layer 110d. In addition, the touch sensing may be made inaccurate due to the parasitic capacitance CP2. Therefore, it is necessary to reduce the magnitude of the parasitic capacitance CP2.

Figure 6A:
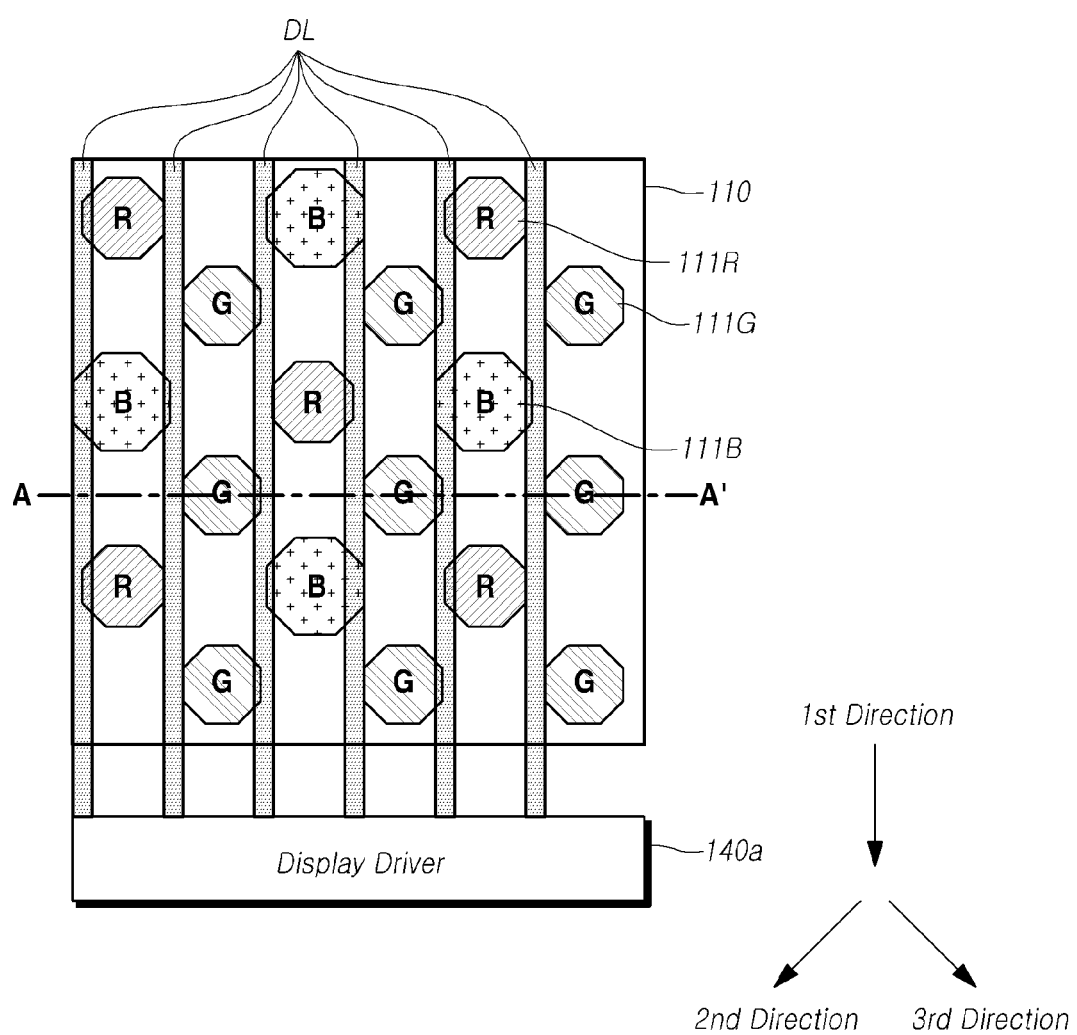
FIG. 6A is a conceptual view illustrating an arrangement of aperture areas and data lines in a display device according to aspects of the present disclosure.
Figure 6B:
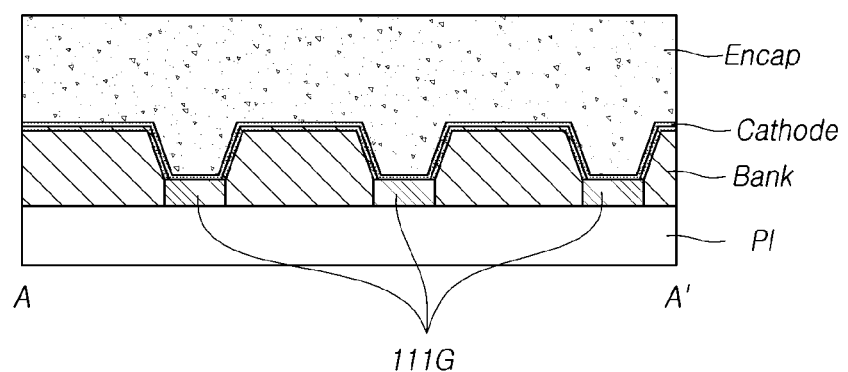
FIG. 6B is a cross-sectional view illustrating a cross-section taken along line A-A' in FIG. 6A.

FIG. 6A is a conceptual view illustrating an arrangement of aperture areas and data lines in a display device according to aspects of the present disclosure, and FIG. 6B is a cross-sectional view illustrating a cross-section taken along line A-A' in FIG. 6A.

Referring to FIGS. 6A and 6B, a bank (Bank) may be formed on the substrate PI of the display panel. The substrate PI may include a flexible material. The substrate PI may include polyamide. In the bank (Bank), grooves having a constant height may be formed, and an organic light-emitting layer may be disposed in each of the grooves. In addition, the bank (Bank) having an organic light-emitting layer formed therein may be called a light emitting layer. The organic light-emitting layer may include a red organic light-emitting layer 111R emitting red light, a green organic light-emitting layer 111G emitting green light, and a blue organic light-emitting layer 111B emitting blue light. The red organic light-emitting layer 111R, the green organic light-emitting layer 111G, and the blue organic light-emitting layer 111B may correspond to sub-pixels, respectively. In addition, the area in the organic light-emitting layer is formed in the bank (Bank), may be called a light-emitting area, and the region in which the organic light-emitting layer is not formed, may be called a non-light-emitting area.

A plurality of data lines DL extending in a first direction may be arranged on the substrate PI. The plurality of data lines DL may be disposed under the bank (Bank) and may be formed using a source drain metal. Although not illustrated here, a plurality of gate lines extending in a second direction and intersecting the plurality of data lines DL may be disposed on the substrate PI. However, the present disclosure is not limited thereto, and a plurality of gate lines extending in the first direction and a plurality of data lines DL extending in the second direction may be disposed on the substrate PI. In addition, the plurality of data lines DL may be connected to the display driver 140a.

In addition, a cathode electrode may be formed on the bank (Bank). Further, a sealing substrate (Encap) may be formed on the cathode electrode (Cathode).

Figure 7A:
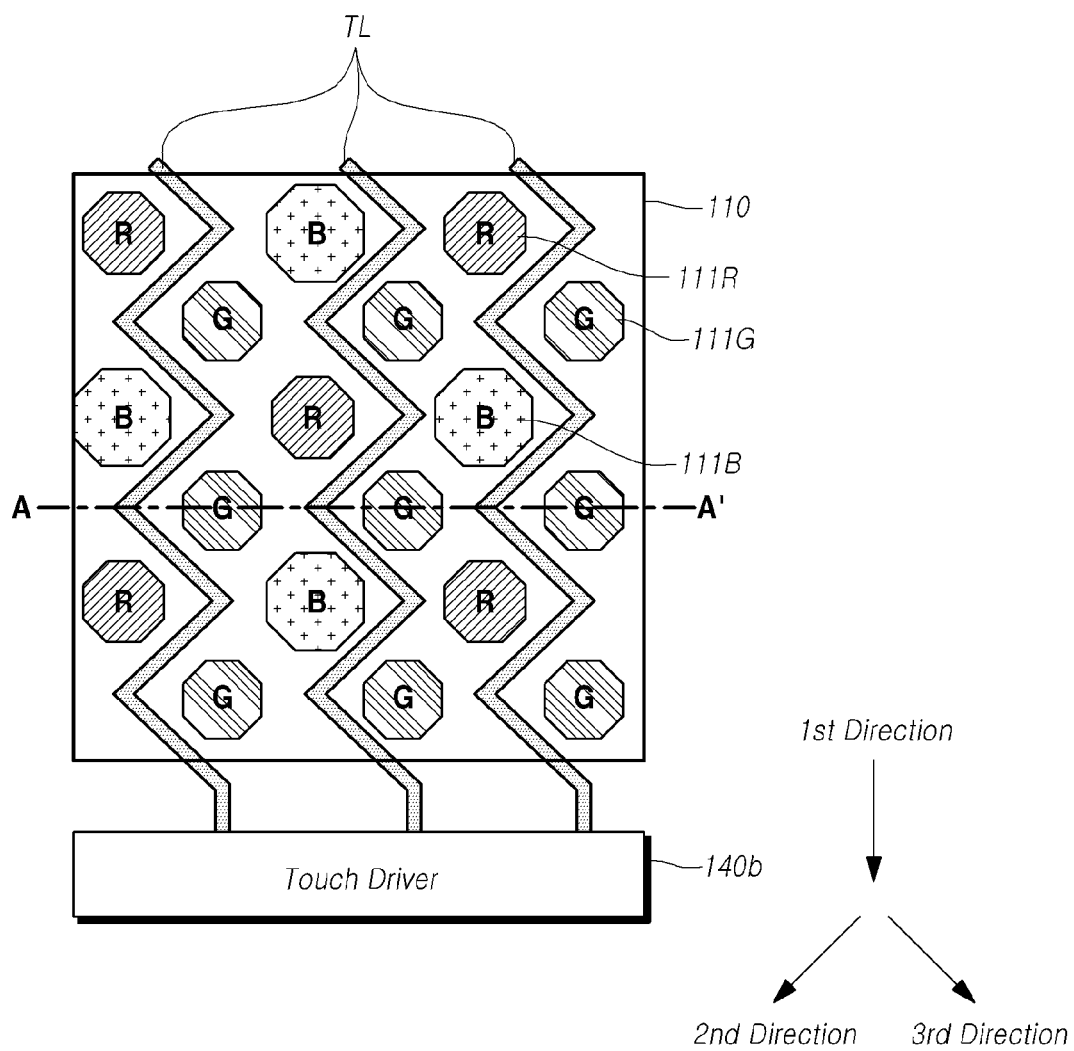
FIG. 7A is a conceptual view illustrating an arrangement of touch wiring lines disposed on a sealing substrate in a display device according to aspects of the present disclosure.
Figure 7B:
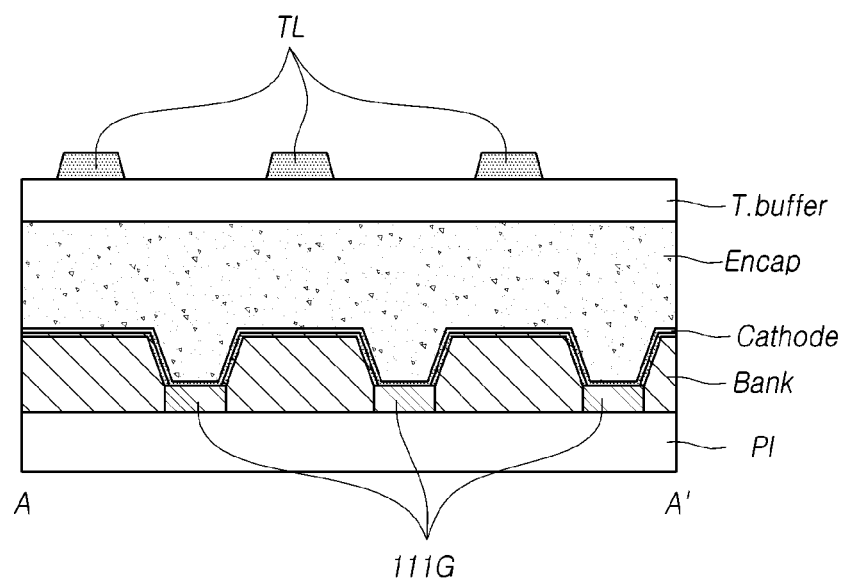
FIG. 7B is a cross-sectional view illustrating a cross-section taken along line A-A' in FIG. 7A.

FIG. 7A is a conceptual view illustrating an arrangement of touch wiring lines disposed on a sealing substrate in a display device according to aspects of the present disclosure, and FIG. 7B is a cross-sectional view illustrating a cross-section taken along line A-A' in FIG. 7A.

Referring to FIGS. 7A and 7B, touch wiring lines TL may be formed on the sealing substrate (Encap). The touch wiring lines TL may transmit a touch signal in the first direction, and may be alternately extend in the second direction and the third direction, which have a predetermined angle with the first direction in an area.

Further, the touch wiring lines TL may be disposed on the bank (Bank) so as to be connected to the non-light-emitting area.

In addition, in order to prevent the sealing substrate (Encap) when the touch wiring lines TL are formed, a touch buffer layer (T.buffer) may be formed on the sealing substrate (Encap) and then the touch wiring lines TL may be formed thereon.

In addition, the touch wiring lines TL may be connected to the touch driver 140b. When the touch wiring lines TL are disposed as described above, the number of required touch wiring numbers may correspond to a half of the number of data lines. Therefore, it is possible to reduce the number of data wiring lines TL. In addition, since the number of data wiring lines TL is reduced, it is possible to reduce the magnitude of the parasitic capacitance formed between the data wiring lines TL and the touch wiring lines TL.

Figure 8A:
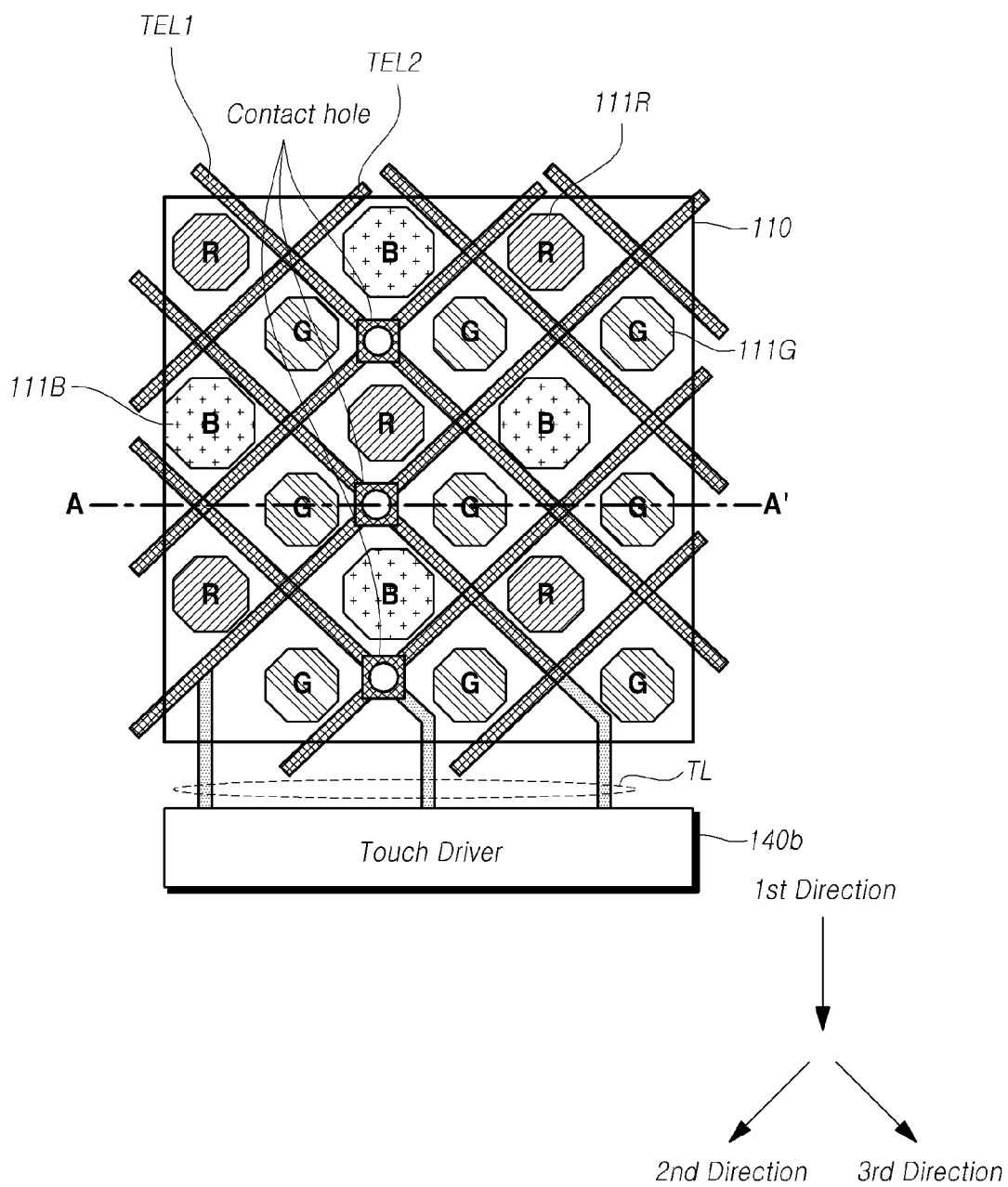
FIG. 8A is a conceptual view illustrating an arrangement of touch electrodes disposed on touch wiring lines in a display device according to aspects of the present disclosure.
Figure 8B:
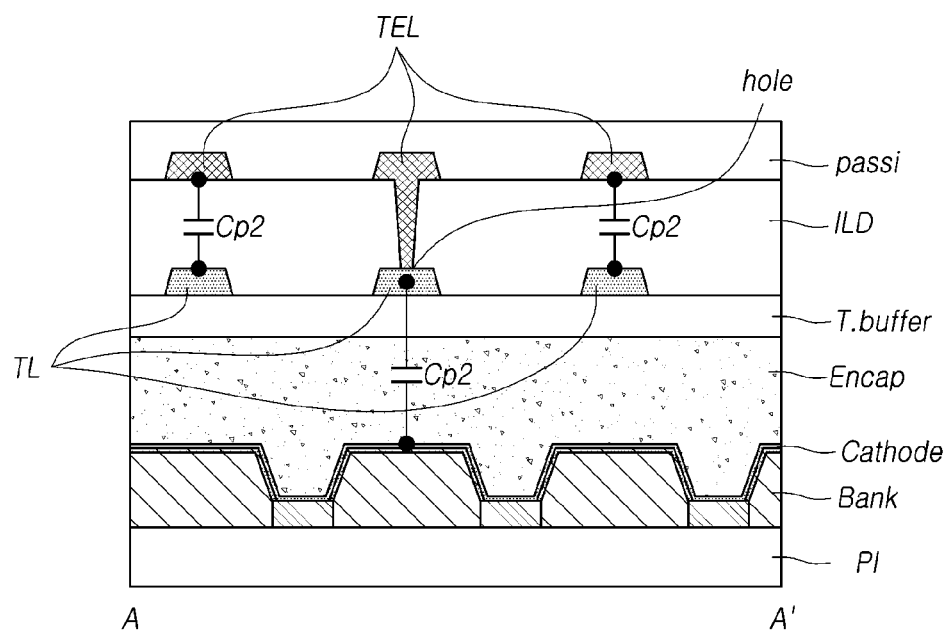
FIG. 8B is a cross-sectional view illustrating a cross-section taken along line A-A' in FIG. 8A.

FIG. 8A is a conceptual view illustrating an arrangement of touch electrodes disposed on touch wiring lines in a display device according to aspects of the present disclosure, and FIG. 8B is a cross-sectional view illustrating a cross-section taken along line A-A' in FIG. 8A.

Referring to FIGS. 8A and 8B, a touch insulating film ILD may be formed on the touch wiring lines TL, and a touch electrode TE may be formed on the touch insulating film ILD. The touch electrode TE may include a plurality of electrode lines, which may include a plurality of first touch electrode lines TEL1 arranged in the second direction and a plurality of second touch electrode lines TEL2 arranged in the third direction. In addition, the first touch electrode lines TEL1 and the second touch electrode lines TEL2 may partially overlap the touch wiring lines TL, which are disposed therebelow.

In addition, one touch wiring line TL may be arranged to overlap the first touch electrode lines TEL1 in the second direction and to overlap the second touch electrode lines TEL2 in the third direction. The touch electrode TE and the touch wiring lines TL may be contacted through at least one contact hole formed in the touch insulating film ILD in at least one area. It is illustrated that the number of contact holes is three. However, this is illustrative, and the present disclosure is not limited thereto.

The touch electrode TE may include a mesh shape having a plurality of openings formed by intersecting a plurality of first touch electrode lines TEL1 and a plurality of second touch electrode lines TEL2. Light-emitting areas of the bank (Bank) may be formed corresponding to the openings.

In addition, a passivation layer (passi) protecting the touch electrode may be formed on the touch electrode lines TEL. The passivation layer (passi) may be an organic film or an inorganic film.

In addition, a parasitic capacitance CP2 may be formed between the touch wiring lines TL and the touch electrode line TEL.

Figure 9A:
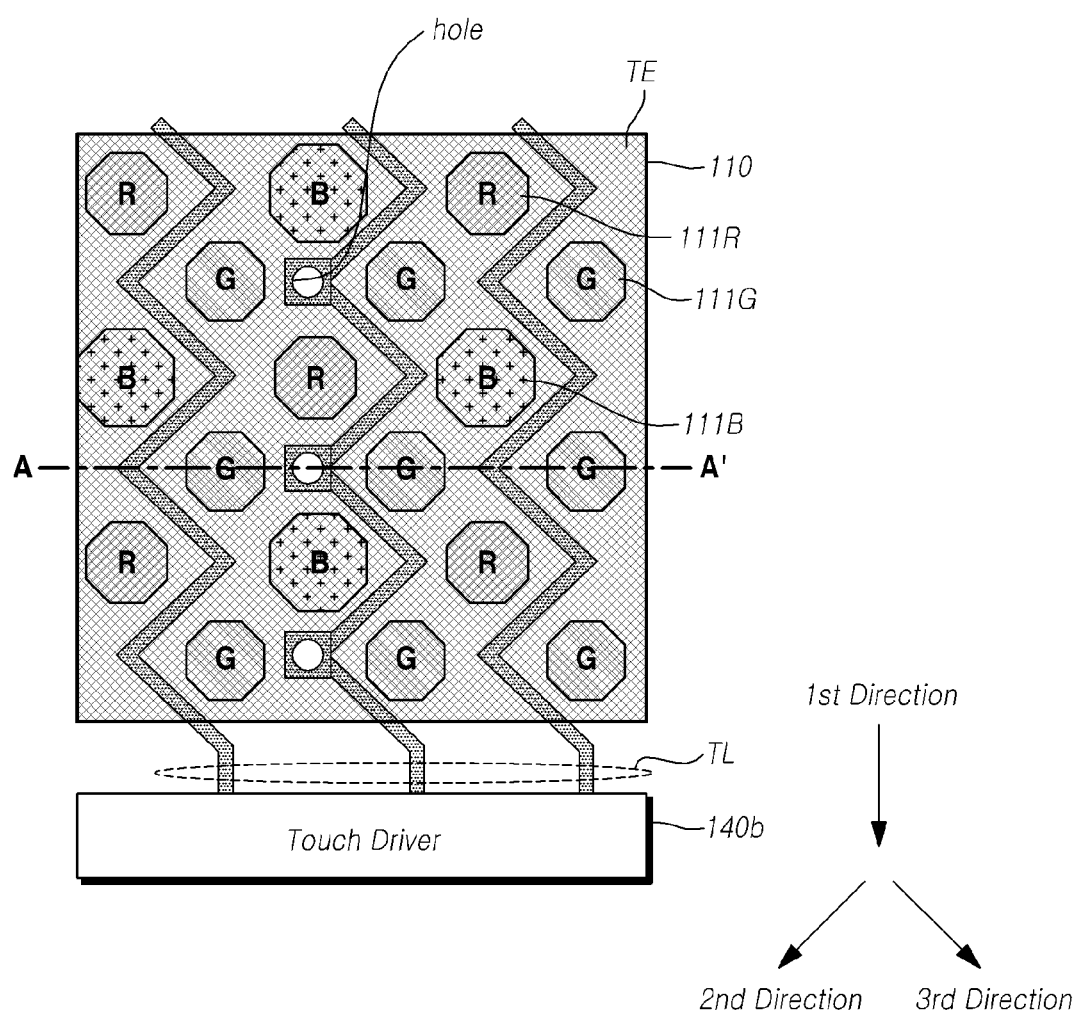
FIG. 9A is a conceptual view illustrating an arrangement of touch electrodes disposed on touch wiring lines in a display device according to aspects of the present disclosure.
Figure 9B:
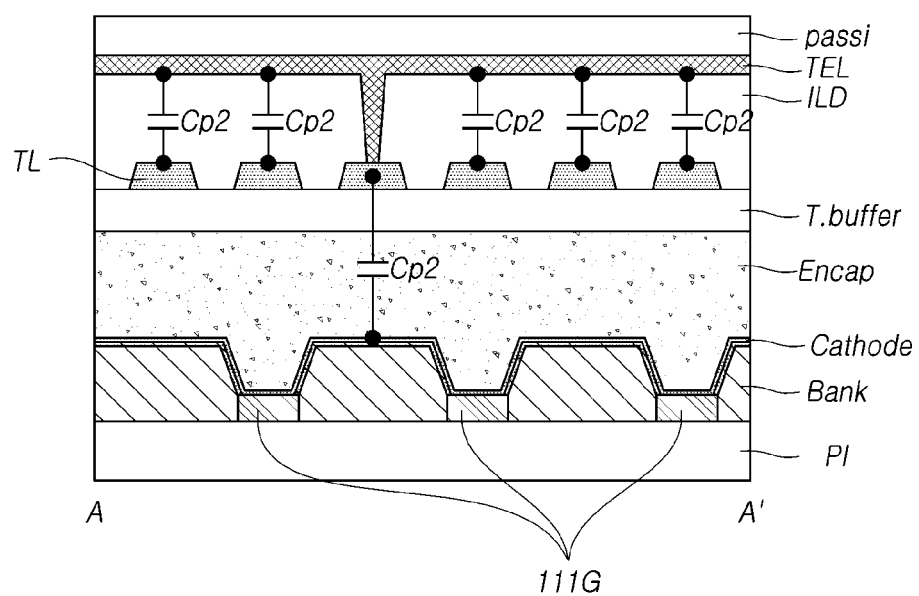
FIG. 9B is a cross-sectional view illustrating a cross-section taken along line A-A' in FIG. 9A.

FIG. 9A is a conceptual view illustrating an arrangement of touch electrodes disposed on touch wiring lines in a display device according to aspects of the present disclosure, and FIG. 9B is a cross-sectional view illustrating a cross-section taken along line A-A' in FIG. 9A.

Referring to FIGS. 9A and 9B, a touch insulating film ILD may be formed on the touch wiring lines TL, and a touch electrode TE may be formed on the touch insulating film ILD. The touch electrodes TE may include transparent electrodes. The transparent electrode may be formed of Indium Tin Oxide (ITO) or Indium Zinc Oxide (IZO). However, the present disclosure is not limited thereto. When the touch electrodes TE include transparent electrodes, separate openings are not required for the touch electrodes TE, and the touch electrodes is not required to have a special shape.

The touch electrode TE and the touch wiring lines TL may be contacted through at least one contact hole formed in the touch insulating film ILD in at least one area.

Figure 10A:
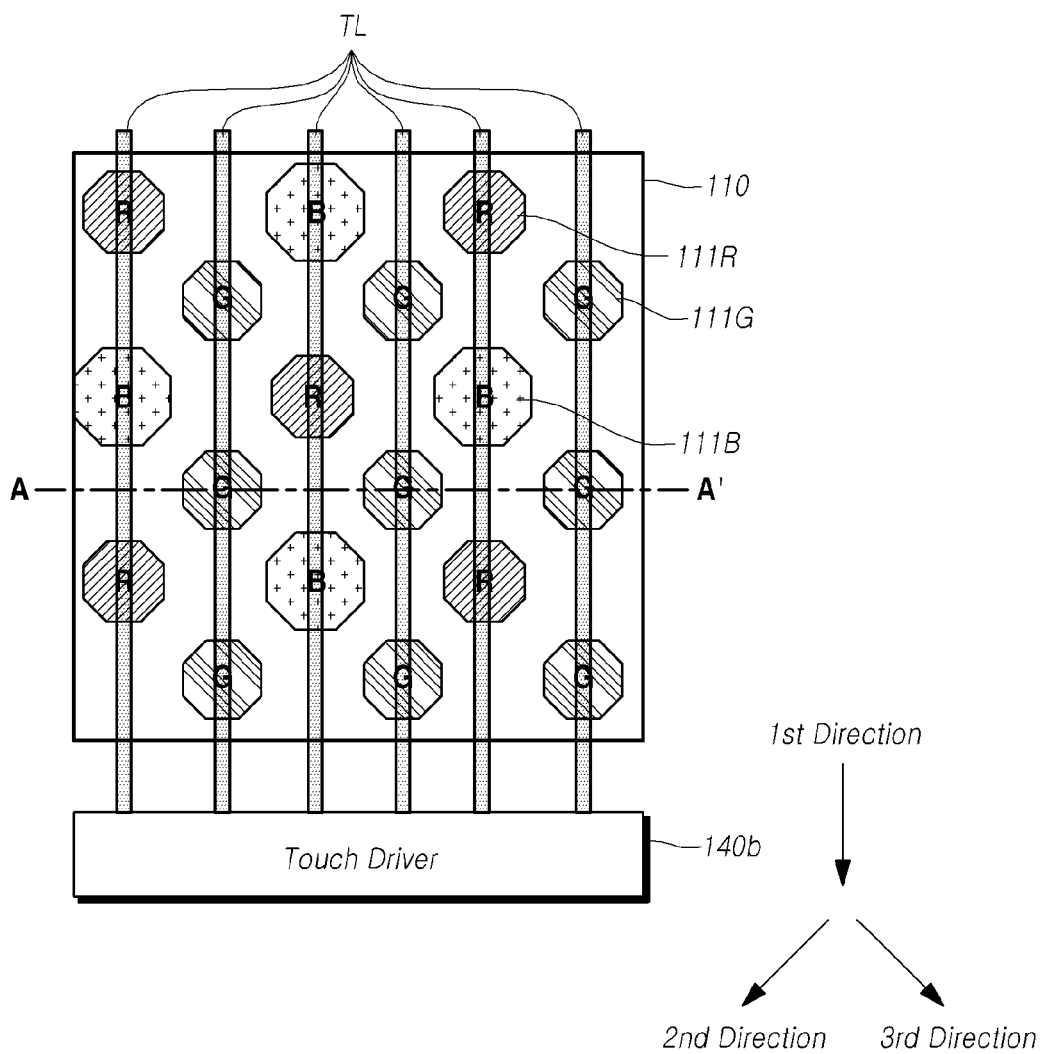
FIG. 10A is a conceptual view illustrating an arrangement of touch wiring lines disposed on a sealing substrate in a display device according to aspects of the present disclosure.
Figure 10B:
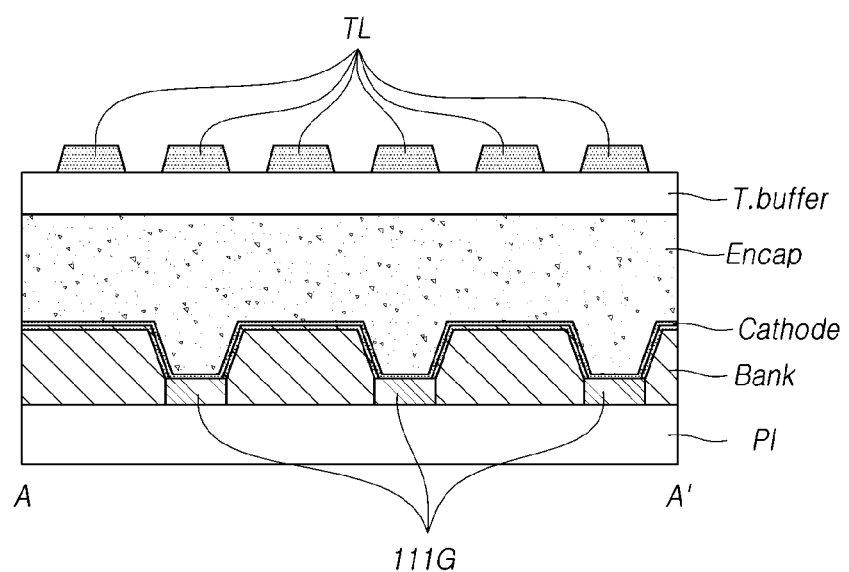
FIG. 10B is a cross-sectional view illustrating a cross section taken along line A-A' in FIG. 10A.

FIG. 10A is a conceptual view illustrating an arrangement of touch wiring lines disposed on a sealing substrate in a display device according to aspects of the present disclosure, and FIG. 10B is a cross-sectional view illustrating a cross-section taken along line A-A' in FIG. 10A.

Referring to FIGS. 10A and 10B, a plurality of touch wiring lines TL may be formed on a sealing substrate (Encap). One touch wiring line TL may extend in the first direction and is capable of transmitting a touch signal.

Further, the touch wiring line TL may be disposed on the light-emitting layer and between two adjacent data lines.

In addition, in order to prevent the sealing substrate (Encap) when the touch wiring lines TL are formed, a touch buffer layer (T.buffer) may be formed on the sealing substrate (Encap) and then the touch wiring lines TL may be formed thereon.

In addition, the touch wiring lines TL may be connected to the touch driver 140b.

Figure 11A:
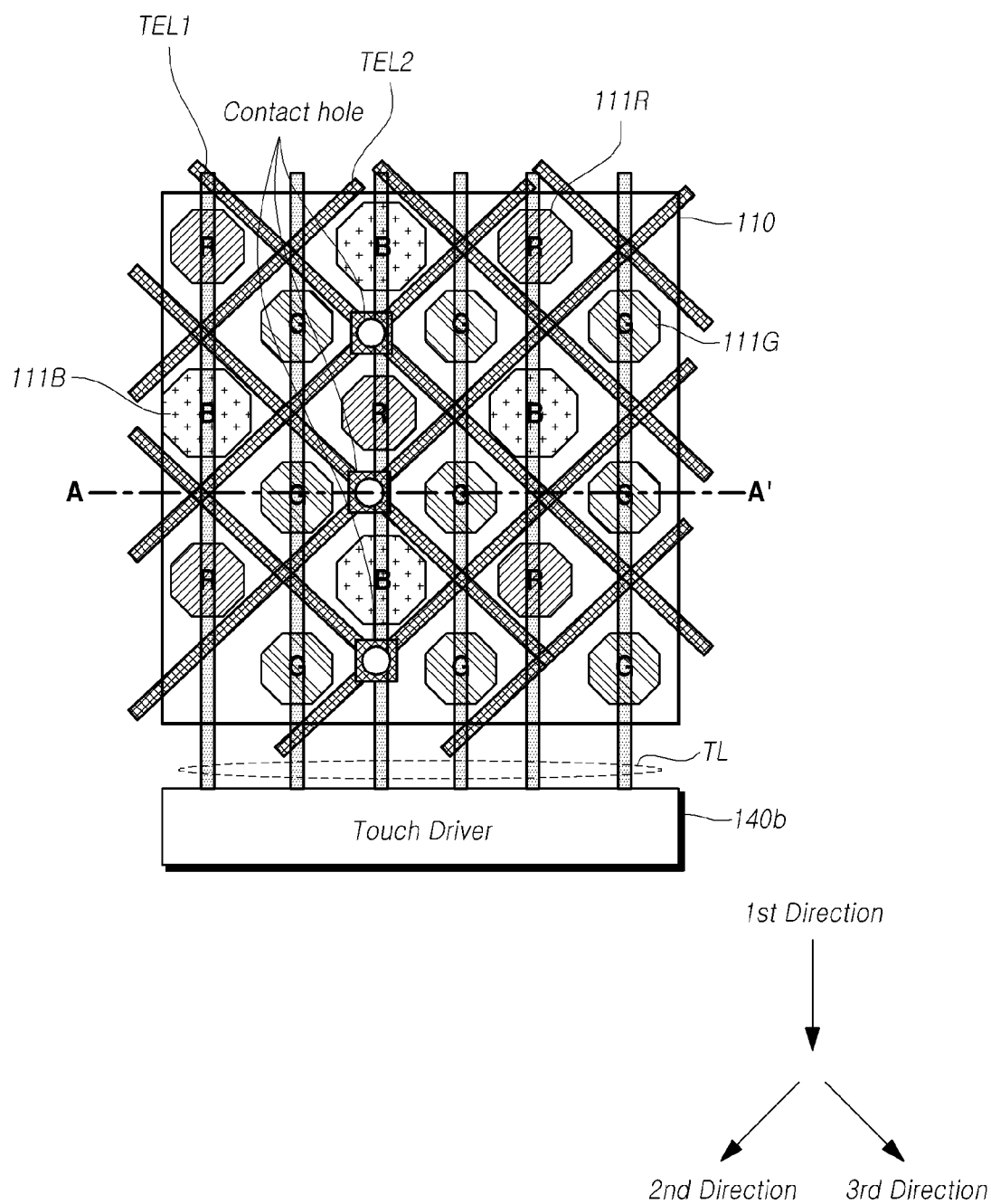
FIG. 11A is a conceptual view illustrating an arrangement of touch electrodes disposed on touch wiring lines in a display device according to aspects of the present disclosure.
Figure 11B:
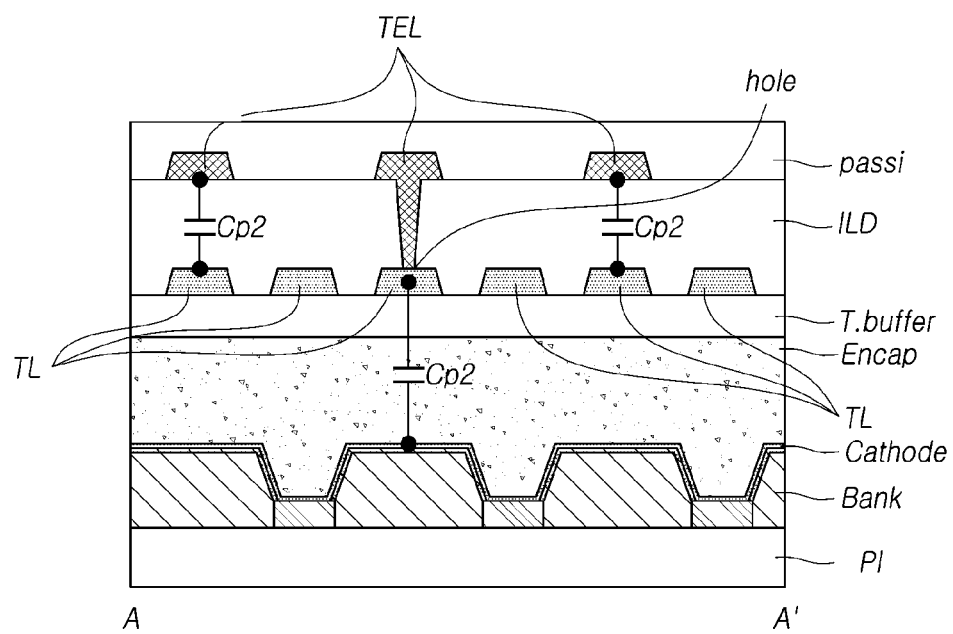
FIG. 11B is a cross-sectional view illustrating a cross section taken along line A-A' in FIG. 11A.

FIG. 11A is a conceptual view illustrating an arrangement of touch electrodes disposed on touch wiring lines in a display device according to aspects of the present disclosure, and FIG. 11B is a cross-sectional view illustrating a cross-section taken along line A-A' in FIG. 11A.

Referring to FIGS. 11A and 11B, a touch insulating film ILD may be formed on the touch wiring lines TL, and a touch electrode TE may be formed on the touch insulating film ILD. The touch electrode TE may include a plurality of electrode lines, which may include a plurality of first touch electrode lines TEL1 arranged in the second direction and a plurality of second touch electrode lines TEL2 arranged in the third direction. The first touch electrode lines TEL1 and the second touch electrode lines TEL2 may be overlapped each other. In addition, the first touch electrode lines TEL1 and the second touch electrode lines TEL2 may overlap a touch wiring line TL disposed therebelow in a portion where the first touch electrode lines TEL1 and the second touch electrode lines TEL2 are overlapped each other.

A contact hole is formed in a portion where the first touch electrode line TEL1 and the second touch electrode line TEL2 are overlapped each other and the first touch electrode line TEL1 and the second touch electrode line TEL2 may be connected to the touch wiring line TL disposed therebelow. It is illustrated that the number of contact holes is three. However, this is illustrative, and the present disclosure is not limited thereto.

The touch electrode TE may include a mesh shape having a plurality of openings formed by intersecting a plurality of first touch electrode lines TEL1 and a plurality of second touch electrode lines TEL2. Light-emitting areas of the bank (Bank) may be formed corresponding to the openings.

In addition, a passivation layer (passi) protecting the touch electrode may be formed on the touch electrode lines TEL. The passivation layer (passi) may be an organic film or an inorganic film. In addition, a parasitic capacitance CP2 may be formed between the touch wiring lines TL and the touch electrode line TEL.

As described above, since the touch wiring line TL overlaps the first touch electrode line TEL1 and the second touch electrode line TEL2 only at the portion where the first touch electrode line TEL1 and the second touch electrode line TEL2 are overlapped each other, the size of the overlap area of the touch wiring line TL with the first touch electrode line TEL1 and the second touch electrode line TEL2 is small, so that the parasitic capacitance CP2 formed between the touch wiring line TL and the first touch electrode line TEL1 and the second touch electrode line TEL2 can be implemented to have a small magnitude. Therefore, the power consumption can be reduced.

Figure 12A:
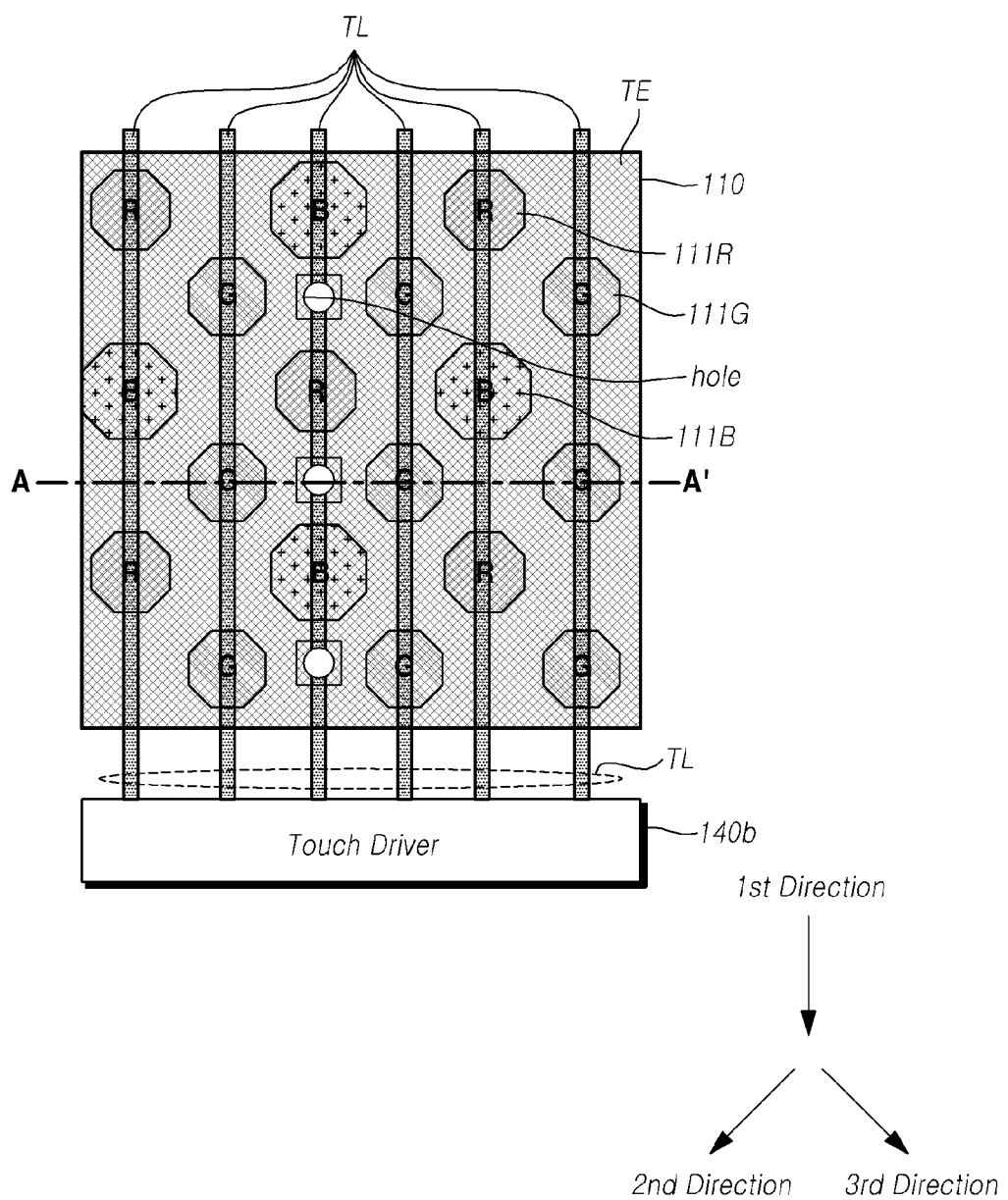
FIG. 12A is a conceptual view illustrating an arrangement of touch electrodes disposed on touch wiring lines in a display device according to aspects of the present disclosure.
Figure 12B:
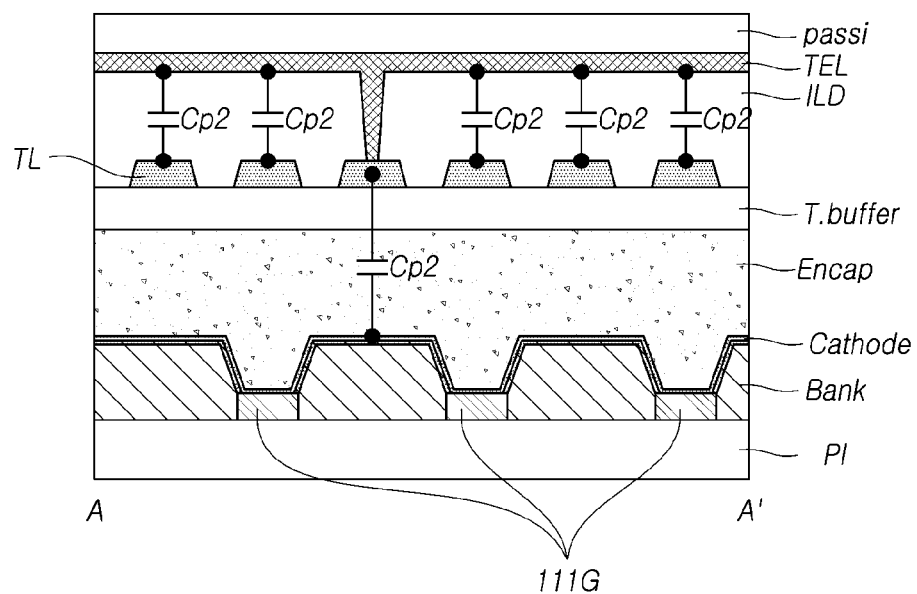
FIG. 12B is a cross-sectional view illustrating a cross-section taken along line A-A' in FIG. 12A.

FIG. 12A is a conceptual view illustrating an arrangement of touch electrodes disposed on touch wiring lines in a display device according to aspects of the present disclosure, and FIG. 12B is a cross-sectional view illustrating a cross-section taken along line A-A' in FIG. 12A.

Referring to FIGS. 12A and 12B, a touch insulating film ILD may be formed on the touch wiring lines TL, and a touch electrode TE may be formed on the touch insulating film ILD. The touch electrodes TE may include transparent electrodes. The transparent electrode may be formed of Indium Tin Oxide (TIN) or Indium Zinc Oxide (IZO). However, the present disclosure is not limited thereto. When the touch electrodes TE include transparent electrodes, separate openings are not required for the touch electrodes TE, and the touch electrodes are not required to have a special shape.

The touch electrode TE and the touch wiring lines TL may be contacted through at least one contact hole formed in the touch insulating film ILD in at least one area.

Figure 13:
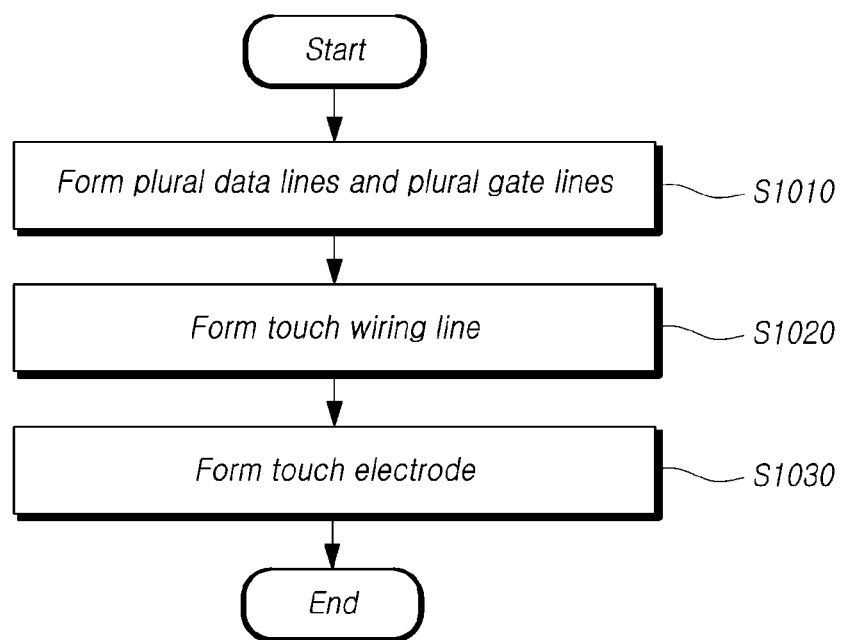
FIG. 13 is a flowchart illustrating method of manufacturing a display device according to aspects of the present disclosure.

FIG. 13 is a flowchart illustrating a method of manufacturing a display device according to aspects of the present disclosure.

Referring to FIG. 13, in the method of manufacturing a display device, a plurality of data lines and a plurality of gate lines intersecting each other may be formed, and the plurality of data lines or the plurality of gate lines may be arranged in a first direction (S1010). The first direction may be a direction in which the display driver illustrated in FIG. 1 is oriented. In addition, a plurality of gate lines may be formed, then an insulating film may be deposited thereon, and a plurality of data lines may be formed thereon. Then, a flattening film may be formed on thereon, then the flattening may be patterned to form an anode electrode, and then a light-emitting layer including an organic light-emitting layer on the flattening film on which the anode electrode is formed. At this time, the light-emitting layer may include a plurality of light-emitting areas in which an organic light-emitting film is formed and a non-light-emitting area in which no light-emitting area is formed. The light-emitting layer includes a bank having a plurality of grooves formed therein, and the organic light-emitting film may be disposed in the grooves of the bank. In addition, a cathode electrode may be formed on the light-emitting layer. Further, a sealing substrate may be formed to protect the light emitting layer.

A plurality of touch wiring lines are formed on the data lines and the gate lines in such a manner that, among the plurality of touch wiring lines, at least one touch wiring line is disposed in the first direction between two adjacent data lines or between two adjacent gate lines (S1010). Further, the touch wiring lines may extend in the first direction along the light-emitting area of the light emitting layer. The sealing substrate may be damaged when the touch wiring lines are formed. Thus, in order to prevent the sealing substrate from being damaged, the touch wiring lines may be formed after a touch buffer layer is formed on the sealing substrate.

A touch electrode may be formed on at least one touch wiring line among the plurality of touch wiring lines (S1030). A touch insulating film may be formed on the touch wiring lines and a touch electrode may be formed on the touch insulating film. The touch electrode may include a mesh shape including a plurality of openings formed by intersecting a first touch electrode line and the plurality of second touch electrode lines. Further, the openings may be formed corresponding to the light-emitting layer. The wording "the openings correspond to the light emitting layer" may mean that the openings are formed at positions where the openings overlap the light emitting layer. In addition, the first touch electrode line may extend in a second direction having a predetermined angle with the first direction in which the touch wiring lines extend, and the second touch electrode lines may extend in a third direction different from the second direction.

The touch wiring line may be arranged to overlap a portion where the first touch electrode line and the plurality of second touch electrode lines intersect each other. Accordingly, it is possible to reduce the magnitude of a parasitic capacitance between the touch wiring line and the first touch electrode line and/or the plurality of second touch electrode lines.

Further, the touch electrodes may include transparent electrodes. When the touch electrodes include transparent electrodes, it is not necessary to form separate openings.

In addition, the touch electrodes and the touch wiring lines may be in contact with each other through a contact hole in at least one area. The contact hole is formed in the touch insulating film, and the touch electrode and the touch wiring line may be connected each other through the touch insulating film. The contact hole may be formed at the intersection of the first touch electrode line and the plurality of second touch electrode lines.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display device comprising:
   a light-emitting layer including a plurality of light-emitting areas;
   an encapsulation layer disposed on the light-emitting layer;
   a touch buffer layer disposed on a sealing substrate;
   a plurality of touch wiring lines disposed on the touch buffer layer and arranged in a first direction and overlapping with the light-emitting area; and
   a touch electrode disposed on the plurality of touch wiring lines,
   wherein the plurality of touch wiring lines is connected to the touch electrode-through a contact hole disposed at a portion where one of the touch wiring lines overlaps with the touch electrode.

2. The display device of claim 1, further comprising a plurality of data lines and a plurality of gate lines disposed under the light emitting layer and intersecting each other, wherein the plurality data lines or the plurality gate lines extend in the first direction.

3. The display device of claim 2, wherein the touch electrode includes a plurality of first touch electrode lines and a plurality of second touch electrode lines, wherein the plurality of first touch electrode lines extends in a second direction having a predetermined angle with respect to the first direction, and the plurality of second touch electrode lines extends in a third direction different from the second direction.

4. The display device of claim 3, wherein the plurality of touch wiring lines is connected to the plurality of first touch electrode lines and the plurality of second touch electrode lines through the contact hole disposed at a portion where the plurality of first touch electrode lines and the plurality of second touch electrode lines overlap each other.

5. The display device of claim 1, wherein the touch electrode includes a transparent electrode.

6. The display device of claim 1, wherein at least one of the plurality of touch wiring lines is disposed on two data lines.

7. The display device of claim 1, wherein at least one of the plurality of touch wiring lines is disposed on two data lines.

8. A display device comprising:
   a light-emitting layer including a plurality of light-emitting areas and a non-light-emitting area disposed between the light-emitting areas;
   an encapsulation layer disposed on the light-emitting layer;
   a touch buffer layer disposed on a sealing substrate;
   a plurality of touch wiring lines disposed on the touch buffer layer and arranged on the light emitting layer and connected to the non-light-emitting area; and
   a touch electrode disposed on at least one of the plurality of touch wiring lines,
   wherein the plurality of touch wiring lines is connected to the touch electrode-through a contact hole disposed at a portion where one of the touch wiring lines overlaps with the touch electrode.

9. The display device of claim 8, wherein the touch electrode includes a mesh shape including a plurality of openings formed by intersecting a plurality of first touch electrode lines and a plurality of second touch electrode lines, wherein the plurality of openings is disposed to correspond to the light emitting layer.

10. The display device of claim 9, wherein the plurality of first touch electrode lines and the plurality of second touch electrode lines are disposed in the non-light emitting area and the plurality of first touch electrode lines is arranged to partially overlap the plurality of touch wiring lines.

11. The display device of claim 8, wherein the touch electrode includes a transparent electrode.

12. The display device of claim 8, wherein the touch electrode and the plurality of touch wiring lines are in contact through a contact hole in at least one area.

13. A method of manufacturing a display device, the method comprising:
   forming a plurality of data lines and a plurality of gate lines intersecting each other, wherein the plurality of data lines or the plurality of gate lines is arranged in a first direction;
   disposing a light emitting layer on the plurality of data lines and the plurality of gate lines;
   disposing an encapsulation layer on the light emitting layer;
   disposing a touch buffer layer on a sealing substrate;
   disposing a plurality of touch wiring lines on the touch buffer layer, wherein at least one touch wiring line among the plurality of touch wiring lines is disposed in the first direction between two adjacent data lines or between two adjacent gate lines; and
   disposing a touch electrode disposed on at least one touch wiring line among the plurality of touch wiring lines,
   wherein the plurality of touch wiring lines is connected to the touch electrode-through a contact hole disposed at a portion where one of the touch wiring lines overlaps with the touch electrode.

14. The method of claim 13, wherein the touch electrode includes a mesh shape including a plurality of openings formed by intersecting the plurality of first touch electrode lines and the plurality of second touch electrode lines, wherein the plurality of openings is disposed to correspond to the light emitting layer.

15. A display device comprising:
- a light-emitting layer including a plurality of light-emitting areas;
- an encapsulation layer disposed on the light-emitting layer;
- a touch buffer layer disposed on a sealing substrate;
- a plurality of touch wiring lines disposed on the touch buffer layer and arranged in a first direction and overlapping the light-emitting area; and
- a plurality of first touch electrode lines and plurality of second touch electrode lines disposed on the plurality of touch wiring lines, wherein the plurality of first touch electrode lines extends in a second direction and the plurality of second touch electrode lines extends in a third direction,
- wherein the plurality of touch wiring lines is connected to the plurality of first touch electrode lines and the plurality of second touch electrode lines through a contact hole disposed at a portion where the plurality of first touch electrode lines and the plurality of second touch electrode lines overlaps with each other.

16. The display device of claim 15, wherein the pluralities of first and second touch electrode lines include a transparent electrode.

17. The display device of claim 15, further comprising a sealing substrate disposed between the light-emitting layer and the plurality of touch wiring lines.

18. The display device of claim 15, wherein the first, second and third directions are different from one another.

\* \* \* \* \*